United States Patent
Lim et al.

(10) Patent No.: US 10,013,305 B2
(45) Date of Patent: Jul. 3, 2018

(54) SEMICONDUCTOR DEVICES AND METHODS RELATING TO THE REPAIRING OF THE SAME

(71) Applicant: SK hynix Inc., Icheon-si, Gyeonggi-do (KR)

(72) Inventors: Soo Bin Lim, Icheon-si (KR); Young Hyun Baek, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/477,228

(22) Filed: Apr. 3, 2017

(65) Prior Publication Data

US 2018/0113755 A1    Apr. 26, 2018

(30) Foreign Application Priority Data

Oct. 26, 2016    (KR) .................. 10-2016-0140099

(51) Int. Cl.

| G11C 29/00 | (2006.01) |
|---|---|
| G06F 11/07 | (2006.01) |
| G11C 29/36 | (2006.01) |
| G11C 29/38 | (2006.01) |
| G11C 29/44 | (2006.01) |

(52) U.S. Cl.
CPC ........ *G06F 11/0793* (2013.01); *G06F 11/079* (2013.01); *G06F 11/0727* (2013.01); *G06F 11/0751* (2013.01); *G11C 29/36* (2013.01); *G11C 29/38* (2013.01); *G11C 29/4401* (2013.01)

(58) Field of Classification Search
CPC ............ G06F 11/0727; G06F 11/0751; G06F 11/079; G11C 29/36; G11C 29/4401; G11C 29/38
USPC .................................................. 365/189.09
See application file for complete search history.

(56) References Cited

U.S. PATENT DOCUMENTS

| 6,208,568 | B1 | 3/2001 | Zagar et al. | |
| 7,509,543 | B2* | 3/2009 | Mohr ................... | G11C 17/18 365/201 |
| 8,234,527 | B2* | 7/2012 | Mohr ................... | G11C 17/18 365/201 |
| 2004/0261049 | A1* | 12/2004 | Mohr ................... | G11C 17/18 714/710 |
| 2016/0042813 | A1* | 2/2016 | Kim ..................... | G11C 29/838 365/96 |

FOREIGN PATENT DOCUMENTS

KR    1020120076438 A    7/2012

* cited by examiner

*Primary Examiner* — Vanthu Nguyen
*Assistant Examiner* — Xiaochun L Chen
(74) *Attorney, Agent, or Firm* — William Park & Associates Ltd.

(57) ABSTRACT

A semiconductor device and or method of repairing the semiconductor device may be provided. The semiconductor device may include an error information storage circuit. The error information storage circuit may be configured to latch an address to generate a latched fail address and a rupture control signal.

19 Claims, 7 Drawing Sheets

FIG.2

| IADD<1:2> | | REDUNDANCY AREA | E_FLAG |
|---|---|---|---|
| L | L | FIRST REDUNDANCY CELL ARRAY | L |
| L | H | SECOND REDUNDANCY CELL ARRAY | H |
| H | L | THIRD REDUNDANCY CELL ARRAY | L |
| H | H | FOURTH REDUNDANCY CELL ARRAY | L |

SEMICONDUCTOR DEVICES AND METHODS RELATING TO THE REPAIRING OF THE SAME

CROSS-REFERENCE TO RELATED APPLICATIONS

The present application claims priority under 35 U.S.C 119(a) to Korean Application No. 10-2016-0140099, filed on Oct. 26, 2016, which is incorporated herein by reference in its entirety.

BACKGROUND

1. Technical Field

Embodiments of the present disclosure may generally relate to semiconductor devices and, more particularly, to semiconductor devices relating to the control of a repair operation of a redundancy area and methods of repairing the semiconductor devices.

2. Related Art

Attempts to increase integration density of semiconductor devices have typically resulted in the increase of failed memory cells during the fabrication process of the semiconductor devices. This may lead to lowering the fabrication yield of the semiconductor devices. Even if each semiconductor device has only a single defective memory cell, the semiconductor device will not be supplied to the customers.

A lot of effort has been focused on improving the fabrication yield of highly integrated semiconductor devices. For example, various techniques for repairing addresses of failed memory cells with redundancy memory cells have been proposed to improve the fabrication yield of the highly integrated semiconductor devices.

SUMMARY

According to some embodiments, a semiconductor device and or method of repairing the semiconductor device may be provided. The semiconductor device may include an error information storage circuit. The error information storage circuit may be configured to latch an address to generate a latched fail address and a rupture control signal.

BRIEF DESCRIPTION OF THE DRAWINGS

FIGS. 2 and 3 illustrate a repair operation of the semiconductor device illustrated in FIG. 1.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
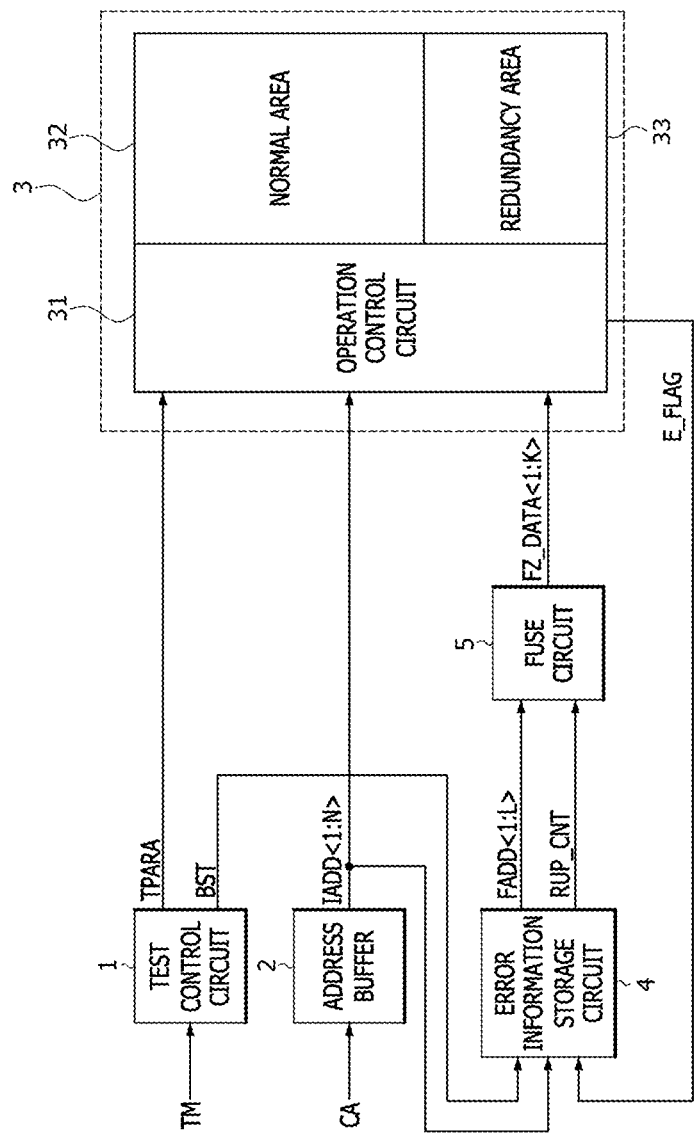
FIG. 1 is a block diagram illustrating a configuration of a semiconductor device according to an embodiment of the present disclosure.

Referring to FIG. 1, a semiconductor device according to an embodiment may include a test control circuit 1, an address buffer 2, a bank 3, an error information storage circuit 4 and a fuse circuit 5. The bank 3 may include an operation control circuit 31, a normal area 32 and a redundancy area 33.

The test control circuit 1 may generate a compressive test signal TPARA and a rupture test signal BST which are enabled in response to a test mode signal TM. The test control circuit 1 may generate the compressive test signal TPARA and the rupture test signal BST which are sequentially enabled in response to the test mode signal TM. The test control circuit 1 may decode the test mode signal TM to generate the compressive test signal TPARA and the rupture test signal BST, any one of which is selectively enabled. Although the test mode signal TM is illustrated as a single signal line in FIG. 1, the test mode signal TM may be set to include a plurality of signals. The compressive test signal TPARA may be enabled to enter a compressive test operation that detects failed cells in the redundancy area 33 by storing data into the redundancy area 33 and sensing levels of the data outputted from the redundancy area 33. The rupture test signal BST may be enabled to enter a rupture test operation that ruptures a fuse array corresponding to failed cells in the redundancy area 33.

The address buffer 2 may generate an address IADD<1:N> in response to a command and address (command/address) signal CA. The address buffer 2 may buffer the command/address signal CA to generate the address IADD<1:N>. Although the command/address signal CA is illustrated as a single signal line in FIG. 1, the command/address signal CA may be set to include a plurality of signals. The command/address signal CA may be set to include a plurality of bits which are inputted in series to the address buffer 2 through a single pad. The address IADD<1:N> may be sequentially counted during the compressive test operation. The address buffer 2 may include a plurality of general buffers.

The operation control circuit 31 may generate an error flag signal E_FLAG including information on a normality and abnormality (normality/abnormality) of the redundancy area 33, in response to the compressive test signal TPARA. The operation control circuit 31 may store data having a predetermined level into the redundancy area 33 according to a combination of the address IADD<1:N>, in response to the compressive test signal TPARA. The operation control circuit 31 may sense the data outputted from the redundancy area 33 to generate the error flag signal E_FLAG according to a combination of the address IADD<1:N>, in response to the compressive test signal TPARA. The operation control circuit 31 may perform an operation that stores data into all of redundancy cell arrays (33-1, . . . , and 33-K of FIG. 3) included in the redundancy area 33 and may perform an operation that outputs the data in the redundancy area 33 to sense the data outputted from the redundancy area 33. If at least one failed cell exists in any one of normal cell arrays (32-1, . . . , and 32-K of FIG. 3) included in the normal area 32, the operation control circuit 31 may replace the normal cell array including the at least one failed cell with one of the redundancy cell arrays (33-1, . . . , and 33-K of FIG. 3)

included in the redundancy area 33. The operation control circuit 31 may replace the normal cell array including the at least one failed cell with one of the redundancy cell arrays (33-1, . . . , and 33-K of FIG. 3), in response to fuse data FZ_DATA<1:K>. The operation control circuit 31 may access to the redundancy cell arrays (33-1, . . . , and 33-K of FIG. 3) without accessing to the normal cell arrays (32-1, . . . , and 32-K of FIG. 3), in response to the compressive test signal TPARA and the fuse data FZ_DATA<1:K>. The repair operation may be an operation that replaces the normal cell arrays (32-1, . . . , and 32-K of FIG. 3) including failed cells with the redundancy cell arrays (33-1, . . . , and 33-K of FIG. 3).

Figure 3:
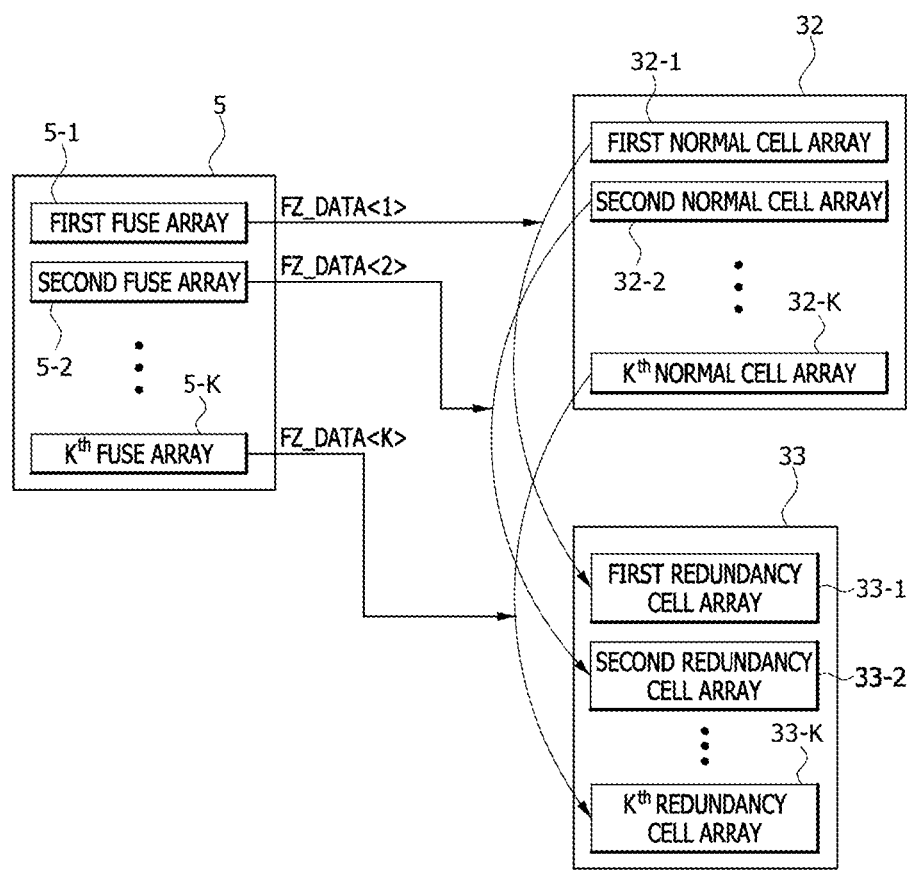

The normal area 32 may include the normal cell arrays (32-1, . . . , and 32-K of FIG. 3). The normal area 32 may store data (not illustrated) into the normal cell arrays (32-1, . . . , and 32-K of FIG. 3) which are selected by the address IADD<1:N>. The normal area 32 may output the data stored in the normal cell arrays (32-1, . . . , and 32-K of FIG. 3) which are selected by the address IADD<1:N>.

The redundancy area 33 may include the redundancy cell arrays (33-1, . . . , and 33-K of FIG. 3). The redundancy area 33 may store data (not illustrated) into the redundancy cell arrays (33-1, . . . , and 33-K of FIG. 3) which are selected by the address IADD<1:N>. The redundancy area 33 may output the data stored in the redundancy cell arrays (33-1, . . . , and 33-K of FIG. 3) which are selected by the address IADD<1:N>. The redundancy area 33 may be realized using a general redundancy area including a plurality of redundancy cell arrays for replacing the normal cell arrays (32-1, . . . , and 32-K of FIG. 3) including failed cells.

The error information storage circuit 4 may latch the address IADD<1:N> to generate a latched fail address FADD<1:L> and a rupture control signal RUP_CNT, in response to the error flag signal E_FLAG. The error information storage circuit 4 may latch the address IADD<1:N> if the error flag signal E_FLAG is enabled. The error information storage circuit 4 may latch the error flag signal E_FLAG. The error information storage circuit 4 may output the latched address as the latched fail address FADD<1:L> in response to the rupture test signal BST. The error information storage circuit 4 may output the latched error flag signal as the rupture control signal RUP_CNT in response to the rupture test signal BST. The latched fail address FADD<1:L> may include position information on an erroneous redundancy cell array of the plurality of redundancy cell arrays (33-1, . . . , and 33-K of FIG. 3) included in the redundancy area 33.

The fuse circuit 5 may control the repair operation of the redundancy area 33 in response to the latched fail address FADD<1:L> and the rupture control signal RUP_CNT. The fuse circuit 5 may rupture fuses which are connected to fuse arrays (5-1, . . . , and 5-K of FIG. 3) corresponding to the latched fail address FADD<1:L>. The fuse circuit 5 may prohibit the output of the fuse data FZ_DATA<1:K> corresponding to the latched fail address FADD<1:L>. The fuse circuit 5 may output the fuse data FZ_DATA<1:K> for replacing the normal cell arrays (32-1, . . . , and 32-K of FIG. 3) including failed cells with the redundancy cell arrays (33-1, . . . , and 33-K of FIG. 3). The operation of rupturing the fuses may correspond to an operation that applies a high voltage to some fuses selected by the fuse data FZ_DATA<1:K> to cut the selected fuses.

The number "N" of bits included in the address IADD<1:N> may be set to be a natural number, and the number "L" of bits included in the latched fail address FADD<1:L> may be set to be a natural number. In addition, the number "K" of bits included in the fuse data FZ_DATA<1:K> may also be set to be a natural number. The numbers "N", "L" and "K" may be set to be different according to the embodiments.

An operation of the operation control circuit 31 for detecting erroneous cells (i.e., failed cells) in the redundancy area 33 will be described hereinafter with reference to FIG. 2 in conjunction with an example in which the redundancy area 33 includes first to fourth redundancy cell arrays and the second redundancy cell array is an erroneous redundancy cell array.

First, an operation of storing data into the redundancy cell arrays of the redundancy area 33 will be described hereinafter.

The operation control circuit 31 may select the first redundancy cell array according to a first combination of the first and second addresses IADD<1:2>, in response to the compressive test signal TPARA. The operation control circuit 31 may store data having a predetermined level into the first redundancy cell array. The first combination means, for example, that the first address IADD<1> has a logic "low (L)" level and the second address IADD<2> has a logic "low(L)" level.

The operation control circuit 31 may select the second redundancy cell array according to a second combination of the first and second addresses IADD<1:2>, in response to the compressive test signal TPARA. The operation control circuit 31 may store data having a predetermined level into the second redundancy cell array. The second combination means, for example, that the first address IADD<1> has a logic "high(H)" level and the second address IADD<2> has a logic "low(L)" level.

The operation control circuit 31 may select the third redundancy cell array according to a third combination of the first and second addresses IADD<1:2>, in response to the compressive test signal TPARA. The operation control circuit 31 may store data having a predetermined level into the third redundancy cell array. The third combination means, for example, that the first address IADD<1> has a logic "low(L)" level and the second address IADD<2> has a logic "high(H)" level.

The operation control circuit 31 may select the fourth redundancy cell array according to a fourth combination of the first and second addresses IADD<1:2>, in response to the compressive test signal TPARA. The operation control circuit 31 may store data having a predetermined level into the fourth redundancy cell array. The fourth combination means, for example, that the first address IADD<1> has a logic "high(H)" level and the second address IADD<2> has a logic "high(H)" level.

The predetermined level of the data may be set to be a logic "high(H)" level of a logic "low(L)" level.

Next, an operation of detecting an erroneous redundancy cell array in the redundancy area 33 and storing an address of the erroneous redundancy cell array will be described hereinafter.

The operation control circuit 31 may select the first redundancy cell array in response to the first and second addresses IADD<1:2> having the first combination and the compressive test signal TPARA. The operation control circuit 31 may sense logic levels of the data outputted from the first redundancy cell array to generate the error flag signal E_FLAG having a logic "low(L)" level.

The error information storage circuit 4 may not latch the first and second addresses IADD<1:2> having the first combination in response to the error flag signal E_FLAG having a logic "low(L)" level.

The operation control circuit 31 may select the second redundancy cell array in response to the first and second addresses IADD<1:2> having the second combination and the compressive test signal TPARA. The operation control circuit 31 may sense logic levels of the data outputted from the second redundancy cell array to generate the error flag signal E_FLAG having a logic "high(H)" level.

The error information storage circuit 4 may latch the first and second addresses IADD<1:2> having the second combination in response to the error flag signal E_FLAG having a logic "high(H)" level.

The operation control circuit 31 may select the third redundancy cell array in response to the first and second addresses IADD<1:2> having the third combination and the compressive test signal TPARA. The operation control circuit 31 may sense logic levels of the data outputted from the third redundancy cell array to generate the error flag signal E_FLAG having a logic "low(L)" level.

The error information storage circuit 4 may not latch the first and second addresses IADD<1:2> having the third combination in response to the error flag signal E_FLAG having a logic "low(L)" level.

The operation control circuit 31 may select the fourth redundancy cell array in response to the first and second addresses IADD<1:2> having the fourth combination and the compressive test signal TPARA. The operation control circuit 31 may sense logic levels of the data outputted from the fourth redundancy cell array to generate the error flag signal E_FLAG having a logic "low(L)" level.

The error information storage circuit 4 may not latch the first and second addresses IADD<1:2> having the fourth combination in response to the error flag signal E_FLAG having a logic "low(L)" level.

In some embodiments, the operation of storing the data into the selected redundancy cell array and the operation of detecting an error of the selected redundancy cell array will be sequentially performed every combination of the first and second addresses IADD<1:2>.

The repair operation according to an embodiment will be described hereinafter with reference to FIG. 3 in conjunction with an example in which the second redundancy cell array is an erroneous redundancy cell array.

The fuse circuit 5 may rupture a fuse connected to the second fuse array 5-2 corresponding to the latched fail address FADD<1:L>. The fuse circuit 5 may rupture the fuse connected to the second fuse array 5-2 corresponding to the latched fail address FADD<1:L> to prohibit the output of the second fuse data FZ_DATA<2>.

The operation control circuit 31 may replace the first normal cell array 32-1 of the normal area 32 with the first redundancy cell array 33-1 of the redundancy area 33 in response to the first fuse data FZ_DATA<1>, if the first normal cell array 32-1 is an erroneous normal cell array.

The operation control circuit 31 may not replace the second normal cell array 32-2 of the normal area 32 with the second redundancy cell array 33-2 of the redundancy area 33 even though the second normal cell array 32-2 is an erroneous normal cell array, because the second fuse data FZ_DATA<2> is not outputted from the fuse circuit 5.

The operation control circuit 31 may replace the K$^{th}$ normal cell array 32-K of the normal area 32 with the K$^{th}$ redundancy cell array 33-K of the redundancy area 33 in response to the K$^{th}$ fuse data FZ_DATA<K>, if the K$^{th}$ normal cell array 32-K is an erroneous normal cell array.

Although FIG. 3 illustrates an example in which the number of the normal cell arrays included in the normal area 32 is "K" for the purpose of ease and convenience in explanation, the number "K" of the normal cell arrays included in the normal area 32 may be set to be different according to the embodiments. In addition, even though FIG. 3 illustrates an example in which the number of the redundancy cell arrays included in the redundancy area 33 is "K" for the purpose of ease and convenience in explanation, the number "K" of the redundancy cell arrays included in the redundancy area 33 may be set to be different according to the embodiments. In some embodiments, the number of the redundancy cell arrays may be set to be less than the number of the normal cell arrays.

Figure 4:
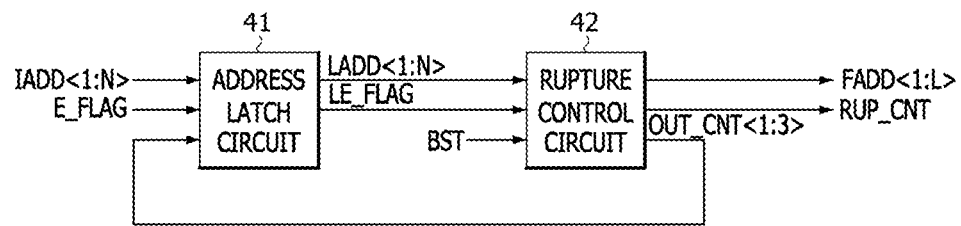
FIG. 4 is a block diagram illustrating a configuration of an error information storage circuit included in the semiconductor device illustrated in FIG. 1.

Referring to FIG. 4, the error information storage circuit 4 may include an address latch circuit 41 and a rupture control circuit 42.

The address latch circuit 41 may latch the address IADD<1:N> in response to the error flag signal E_FLAG. The address latch circuit 41 may output the latched address IADD<1:N> as a latched address LADD<1:N> in response to first to third output count signals OUT_CNT<1:3>. The address latch circuit 41 may latch the error flag signal E_FLAG to output the latched error flag signal E_FLAG as a latched flag signal LE_FLAG.

The rupture control circuit 42 may output the latched address LADD<1:N> as the latched fail address FADD<1:L> in response to the latched flag signal LE_FLAG. The rupture control circuit 42 may output the latched flag signal LE_FLAG as the rupture control signal RUP_CNT. The rupture control circuit 42 may output the first to third output count signals OUT_CNT<1:3> that are sequentially counted in response to the rupture test signal BST.

Figure 5:
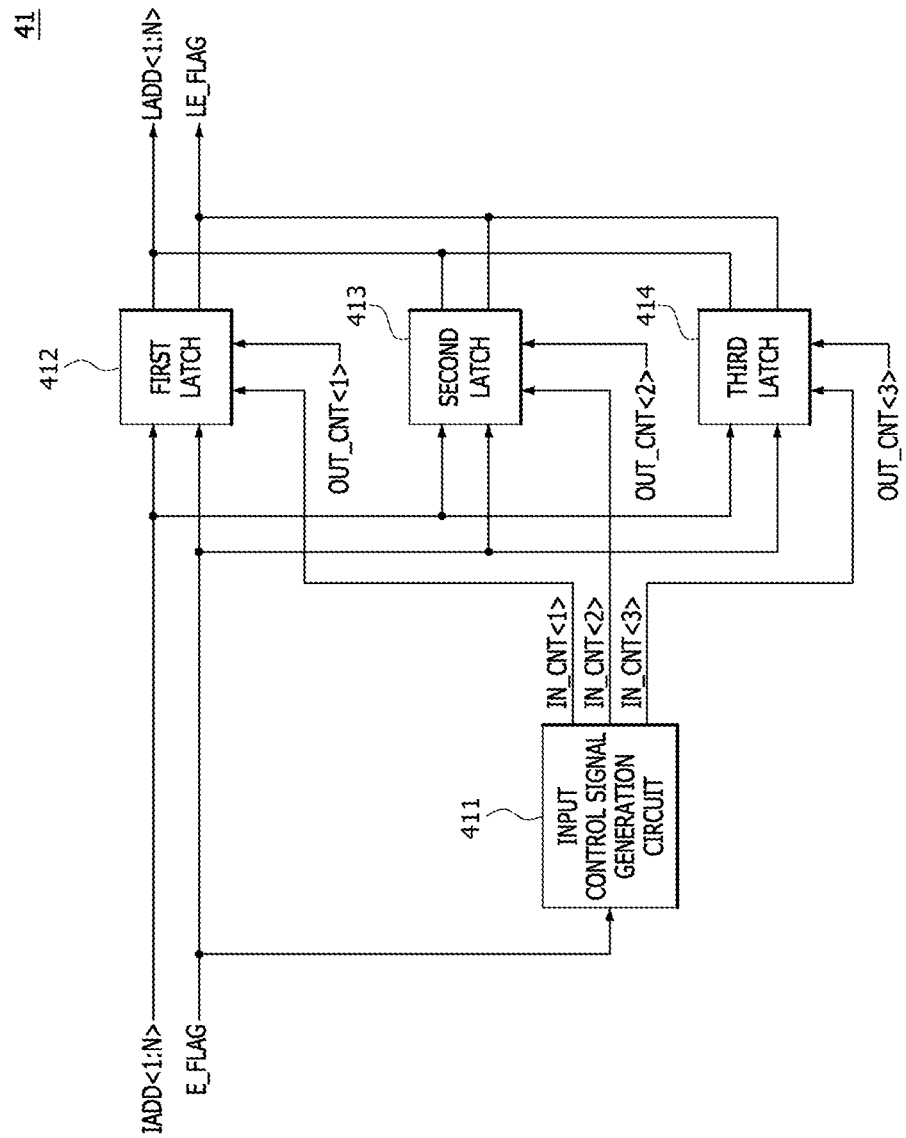
FIG. 5 is a block diagram illustrating a configuration of an address latch circuit included in the error information storage circuit illustrated in FIG. 4.

Referring to FIG. 5, the address latch circuit 41 may include an input control signal generation circuit 411, a first latch 412, a second latch 413 and a third latch 414.

The input control signal generation circuit 411 may generate first to third input control signals IN_CNT<1:3> that are sequentially counted in response to the error flag signal E_FLAG. The input control signal generation circuit 411 may be realized using a general counter and may generate the first to third input control signals IN_CNT<1:3> that are sequentially counted if the error flag signal E_FLAG is inputted to the input control signal generation circuit 411.

The first latch 412 may latch the address IADD<1:N> in response to the first input control signal IN_CNT<1>. The first latch 412 may latch the error flag signal E_FLAG in response to the first input control signal IN_CNT<1>. The first latch 412 may output the latched address IADD<1:N> as the latched address LADD<1:N> in response to the first output count signal OUT_CNT<1>. The first latch 412 may output the latched error flag signal E_FLAG as the latched flag signal LE_FLAG in response to the first output count signal OUT_CNT<1>.

The second latch 413 may latch the address IADD<1:N> in response to the second input control signal IN_CNT<2>. The second latch 413 may latch the error flag signal E_FLAG in response to the second input control signal IN_CNT<2>. The second latch 413 may output the latched address IADD<1:N> as the latched address LADD<1:N> in response to the second output count signal OUT_CNT<2>. The second latch 413 may output the latched error flag signal E_FLAG as the latched flag signal LE_FLAG in response to the second output count signal OUT_CNT<2>.

The third latch 414 may latch the address IADD<1:N> in response to the third input control signal IN_CNT<3>. The third latch 414 may latch the error flag signal E_FLAG in response to the third input control signal IN_CNT<3>. The third latch 414 may output the latched address IADD<1:N> as the latched address LADD<1:N> in response to the third output count signal OUT_CNT<3>. The third latch 414 may output the latched error flag signal E_FLAG as the latched flag signal LE_FLAG in response to the third output count signal OUT_CNT<3>.

Although FIG. 5 illustrates an example in which the number of the latches included in the address latch circuit 41 is three, the number of the latches included in the address latch circuit 41 may be set to be different according to the embodiments.

Figure 6:
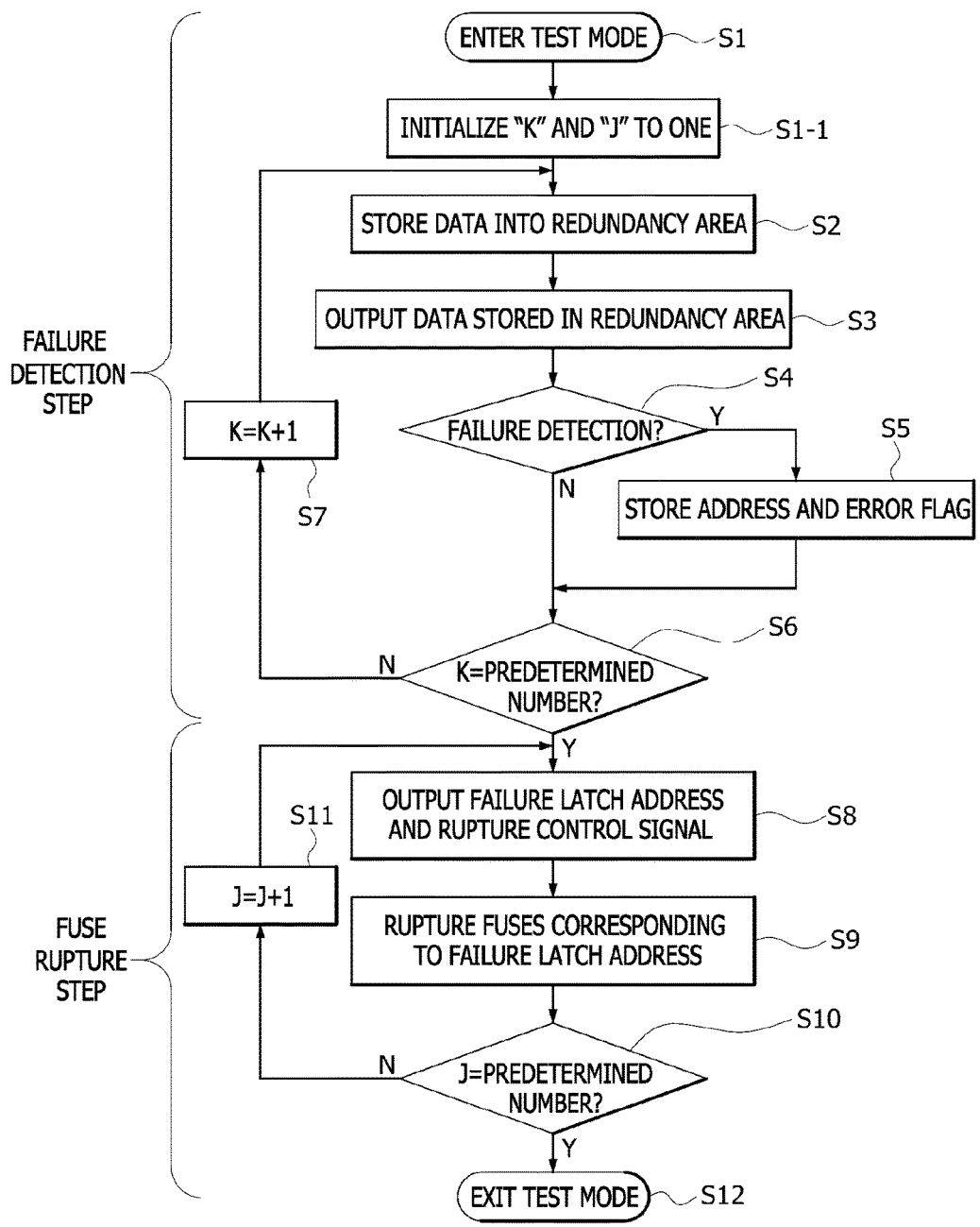
FIG. 6 is a flowchart illustrating a method of repairing a semiconductor device according to an embodiment of the present disclosure.

A method of repairing a semiconductor device according to an embodiment will be described hereinafter with reference to FIG. 6 in conjunction with an example in which the redundancy area 33 includes, for example, first to fourth redundancy cell arrays and the second redundancy cell array is, for example, an erroneous redundancy cell array.

The test control circuit 1 may generate the compressive test signal TPARA in response to the test mode signal TM. The semiconductor device may enter the test mode if the compressive test signal TPARA is generated (see step S1). During the test mode, the compressive test operation and the rupture test operation may be performed. In addition, a number "K" and a number "3" may be initialized to one (see step S1-1).

The address buffer 2 may generate the address IADD<1:N> that are sequentially counted in response to the command/address signal CA.

The operation control circuit 31 may store data having a predetermined logic level into the first redundancy cell array which is selected by the address IADD<1:N> (see step S2). The operation control circuit 31 may output the data stored in the first redundancy cell array selected by the address IADD<1:N> (see step S3). The operation control circuit 31 may sense logic levels of the data outputted from the first redundancy cell array to discriminate whether the first redundancy cell array includes an erroneous cell (see step S4). The operation control circuit 31 may discriminate whether the number "K" is equal to a predetermined number, if no erroneous cell is included in the first redundancy cell array (see step S6). Since no erroneous cell is included in the first redundancy cell array, the error information storage circuit 4 may not latch the address IADD<1:N> in response to the error flag signal E_FLAG. The predetermined number of the number "K" may correspond to the number of the redundancy cell arrays included in the redundancy area 33. Accordingly, in the present embodiment, the predetermined number of the number "K" may be set to be four. If the number "K" is less than the predetermined number (i.e., four), the number "K" may increase by one (see step S7). The operation control circuit 31 may reenter the step S2 with counted address IADD<1:N> because the address IADD<1:N> have a combination for selecting the first redundancy cell array.

The operation control circuit 31 may store data having a predetermined logic level into the second redundancy cell array which is selected by the counted address IADD<1:N> (see step S2). The operation control circuit 31 may output the data stored in the second redundancy cell array selected by the counted address IADD<1:N> (see step S3). The operation control circuit 31 may sense logic levels of the data outputted from the second redundancy cell array to discriminate whether the second redundancy cell array includes an erroneous cell (see step S4). Since the second redundancy cell array is an erroneous redundancy cell array, the operation control circuit 31 may generate the error flag signal E_FLAG. The error information storage circuit 4 may latch and store the counted address IADD<1:N> in response to the error flag signal E_FLAG (see step S5). The operation control circuit 31 may discriminate whether the number "K" is equal to the predetermined number (i.e., four) (see the step S6). If the number "K" is less than the predetermined number (i.e., four), the number "K" may increase by one (see step S7). The operation control circuit 31 may reenter the step S2 with still counted address IADD<1:N> because the counted address IADD<1:N> have a combination for selecting the second redundancy cell array.

The operation control circuit 31 may store data having a predetermined logic level into the third redundancy cell array which is selected by the still counted address IADD<1:N> (see step S2). The operation control circuit 31 may output the data stored in the third redundancy cell array selected by the still counted address IADD<1:N> (see step S3). The operation control circuit 31 may sense logic levels of the data outputted from the third redundancy cell array to discriminate whether the third redundancy cell array includes an erroneous cell (see step S4). Since no erroneous cell is included in the third redundancy cell array, the error information storage circuit 4 may not latch the still counted address IADD<1:N> in response to the error flag signal E_FLAG. The operation control circuit 31 may discriminate whether the number "K" is equal to the predetermined number (i.e., four) (see the step S6). If the number "K" is less than the predetermined number (i.e., four), the number "K" may increase by one (see step S7). The operation control circuit 31 may reenter the step S2 because the still counted address IADD<1:N> have a combination for selecting the third redundancy cell array.

The operation control circuit 31 may store data having a predetermined logic level into the fourth redundancy cell array which is selected by the yet counted address IADD<1:N> (see step S2). The operation control circuit 31 may output the data stored in the fourth redundancy cell array selected by the yet counted address IADD<1:N> (see step S3). The operation control circuit 31 may sense logic levels of the data outputted from the yet redundancy cell array to discriminate whether the fourth redundancy cell array includes an erroneous cell (see step S4). Since no erroneous cell is included in the third redundancy cell array, the error information storage circuit 4 may not latch the yet counted address IADD<1:N> in response to the error flag signal E_FLAG. The operation control circuit 31 may discriminate whether the number "K" is equal to the predetermined number (i.e., four) (see the step S6). Since the number "K" is equal to four, the operation control circuit 31 may not reenter the step S2. That is, the operation control circuit 31 may not reenter the step S2 because the yet counted address IADD<1:N> have a combination for selecting the last redundancy cell array, that is, the fourth redundancy cell array.

The steps S1 to S7 may constitute a failure detection operation (i.e., failure detection step).

The test control circuit 1 may generate the rupture test signal BST which is enabled in response to the test mode signal TM.

The rupture control circuit 42 may output the first output count signal OUT_CNT<1> that is counted in response to the rupture test signal BST.

The address latch circuit 41 may output the latched address IADD<1:N> as the latched address LADD<1:N> and may output the latched error flag signal E_FLAG as the latched flag signal LE_FLAG, in response to the first output count signal OUT_CNT<1>. In such a case, the latched address LADD<1:N> may have a combination for selecting the second redundancy cell array. The rupture control circuit 42 may output the latched address LADD<1:N> as the latched fail address FADD<1:L> in response to the latched flag signal LE_FLAG and may output the latched flag signal LE_FLAG as the rupture control signal RUP_CNT (see step S8).

The fuse circuit 5 may rupture a fuse connected to the second fuse array 5-2 corresponding to the latched fail address FADD<1:L> in response to the rupture control signal RUP_CNT (see step S9). The fuse circuit 5 may prohibit the output of the fuse data FZ_DATA<2> corresponding to the latched fail address FADD<1:L>.

The rupture control circuit 42 may discriminate whether the number "3" is equal to a predetermined number (see step S10). The predetermined number of the number "3" may be set to be the number of bits included in the output count signal OUT_CNT<1:3>. That is, the number "3" may be set to be three.

Since the number "3" is less than three, the number "3" may increase by one (see step S11). That is, the rupture control circuit 42 may output the second output count signal OUT_CNT<2> that is counted in response to the rupture test signal BST because the third output count signal OUT_CNT<3> is not counted.

The address latch circuit 41 may output the latched address LADD<1:N> and the latched flag signal LE_FLAG in response to the second output count signal OUT_CNT<2>. In such a case, the latched address LADD<1:N> and the latched flag signal LE_FLAG may be outputted to have an initialized combination. The rupture control circuit 42 may output the latched address LADD<1:N> as the latched fail address FADD<1:L> in response to the latched flag signal LE_FLAG and may output the latched flag signal LE_FLAG as the rupture control signal RUP_CNT (see the step S8).

The fuse circuit 5 may not rupture the fuse arrays in response to the rupture control signal RUP_CNT (see the step S9).

The rupture control circuit 42 may discriminate whether the number "3" is equal to the predetermined number (see the step S10).

Since the number "3" is still less than three, the number "3" may increase by one (see the step S11). That is, the rupture control circuit 42 may output the third output count signal OUT_CNT<3> that is counted in response to the rupture test signal BST because the third output count signal OUT_CNT<3> is not counted.

The address latch circuit 41 may output the latched address LADD<1:N> and the latched flag signal LE_FLAG in response to the third output count signal OUT_CNT<3>. In such a case, the latched address LADD<1:N> and the latched flag signal LE_FLAG may be outputted to have an initialized combination. The rupture control circuit 42 may output the latched address LADD<1:N> as the latched fail address FADD<1:L> in response to the latched flag signal LE_FLAG and may output the latched flag signal LE_FLAG as the rupture control signal RUP_CNT (see the step S8).

The fuse circuit 5 may not rupture the fuse arrays in response to the rupture control signal RUP_CNT (see the step S9).

The rupture control circuit 42 may discriminate whether the number "3" is equal to the predetermined number (see the step S10). Since the number "3" is equal to the predetermined number (i.e., three), the rupture control circuit 42 may not count the output count signal OUT_CNT<1:3> any more. That is, the rupture control circuit 42 may not count the output count signal OUT_CNT<1:3> because the third output count signal OUT_CNT<3> is counted. Accordingly, the semiconductor device may exit the test mode (see step S12).

The steps S8 to S11 may constitute a fuse rupture operation (i.e., fuse rupture step).

As described above, a semiconductor device according to an embodiment may latch an address of an erroneous redundancy cell array in a redundancy area and may skip a repair operation related to the erroneous redundancy cell array using the latched address to improve a speed of the repair operation. In addition, the present disclosure may provide a method of repairing the semiconductor device. The repair method according an embodiment may be applicable to the semiconductor device, which is in a normal mode, by users.

Figure 7:
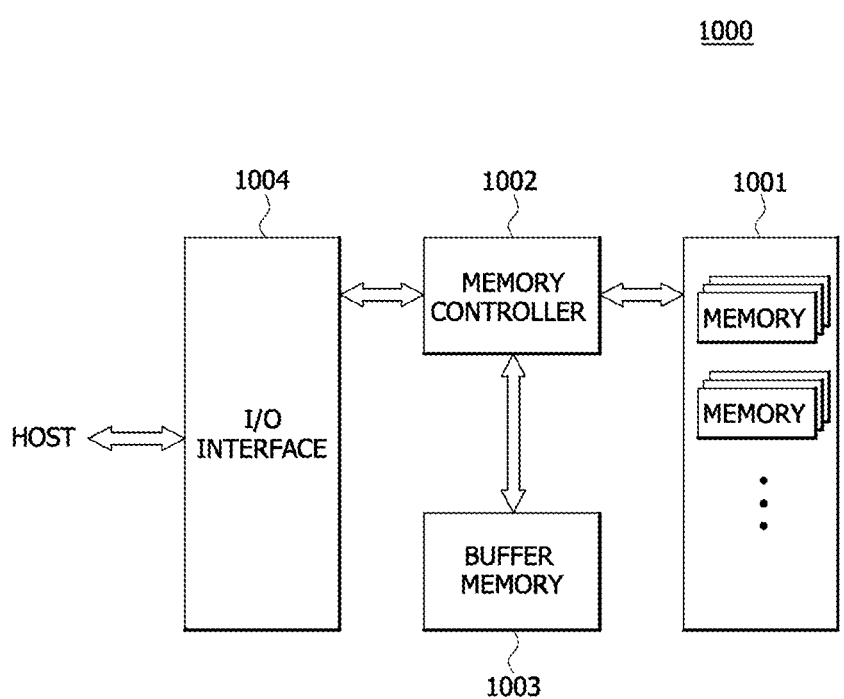
FIG. 7 is a block diagram illustrating a configuration of an electronic system employing a semiconductor device described with reference to FIGS. 1 to 6.

The semiconductor device described with reference to FIGS. 1 to 6 may be applied to an electronic system that includes a memory system, a graphic system, a computing system, a mobile system, or the like. For example, as illustrated in FIG. 7, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 and may read and output the stored data to the memory controller 1002, according to a control signal generated from the memory controller 1002. The data storage circuit 1001 may include the semiconductor devices illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 7 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    an error information storage circuit configured to latch an address to generate a latched fail address and a rupture control signal, if a redundancy area includes a failed redundancy cell; and
    a fuse circuit configured to control a repair operation relating to the redundancy area including the failed redundancy cell based on the latched fail address and the rupture control signal, wherein the error information storage circuit includes:
    an address latch circuit configured to latch the address based on an error flag signal which is enabled if the redundancy area includes a failed redundancy cell, configured to output the latched address based on first and second output count signals, and configured to output the error flag signal as a latched flag signal; and
    a rupture control circuit configured to output the latched address as the latched fail address based on a rupture test signal and the latched flag signal, configured to output the latched flag signal as the rupture control signal, and configured to generate the first and second output count signals that are sequentially counted based on the rupture test signal.

2. The semiconductor device of claim 1, wherein the latched fail address includes position information on an erroneous redundancy cell array of a plurality of redundancy cell arrays included in the redundancy area.

3. The semiconductor device of claim 1, wherein the fuse circuit ruptures a fuse corresponding to the latched fail address to prohibit output of fuse data stored in the fuse circuit.

4. The semiconductor device of claim 3, wherein the rupture of the fuse corresponds to an operation that applies a voltage to the fuse selected by the fuse data to cut the fuse.

5. The semiconductor device of claim 1, wherein the fuse circuit outputs fuse data for replacing a normal cell array including a failed cell with any one of a plurality of redundancy cell arrays included in the redundancy area, based on the latched fail address and the rupture control signal.

6. The semiconductor device of claim 1, wherein the address latch circuit includes:
    an input control signal generation circuit configured to generate first and second input control signals that are sequentially counted based on the error flag signal;
    a first latch configured to latch the address and the error flag signal based on the first input control signal, configured to output the latched address based on the first output count signal, and configured to output the latched error flag signal based on the first output count signal; and
    a second latch configured to latch the address and the error flag signal based on the second input control signal, configured to output the latched address based on the second output count signal, and configured to output the latched error flag signal based on the second output count signal.

7. The semiconductor device of claim 1, further comprising an operation control circuit configured to generate an error flag signal including information on a normality and abnormality (normality/abnormality) of the redundancy area, based on a compressive test signal.

8. The semiconductor device of claim 7, wherein if any one of a plurality of normal cell arrays included in a normal area includes a failed cell, the operation control circuit replaces the erroneous normal cell array including the failed cell with any one of a plurality of redundancy cell arrays included in the redundancy area based on fuse data.

9. The semiconductor device of claim 8, wherein the operation control circuit accesses to one of the redundancy cell arrays without accessing to the normal cell arrays based on the address and fuse data.

10. The semiconductor device of claim 1, wherein the error information storage circuit is configured to output the latched fail address based on a rupture test signal.

11. The semiconductor device of claim 1, wherein the error information storage circuit is configured to output the rupture control signal based on a rupture test signal.

12. A semiconductor device comprising:
    an operation control circuit configured to generate an error flag signal including information on a normality and abnormality (normality/abnormality) of a redundancy area based on a compressive test signal; and
    an error information storage circuit configured to latch an address to generate a latched fail address and a rupture control signal for controlling an repair operation relating to the redundancy area, based on the error flag signal, wherein the error information storage circuit includes:
    an address latch circuit configured to latch the address based on the error flag signal, configured to output the latched address based on first and second output count signals, and configured to output the error flag signal as a latched flag signal; and
    a rupture control circuit configured to output the latched address as the latched fail address based on a rupture test signal and the latched flag signal, configured to output the latched flag signal as the rupture control signal, and configured to generate the first and second output count signals that are sequentially counted based on the rupture test signal.

13. The semiconductor device of claim 12, wherein the operation control circuit replaces any one of normal cell arrays included in a normal area with one of redundancy cell arrays included in the redundancy area, based on fuse data.

14. The semiconductor device of claim 12, wherein the operation control circuit terminates replacing a normal area with the redundancy area, if a combination of the address corresponds to the latched fail address.

15. The semiconductor device of claim 12, wherein the latched fail address includes position information on an erroneous redundancy cell array of a plurality of redundancy cell arrays included in the redundancy area.

16. The semiconductor device of claim 12, wherein the address latch circuit includes:
   an input control signal generation circuit configured to generate first and second input control signals that are sequentially counted based on the error flag signal;
   a first latch configured to latch the address and the error flag signal based on the first input control signal, configured to output the latched address based on the first output count signal, and configured to output the latched error flag signal based on the first output count signal; and
   a second latch configured to latch the address and the error flag signal based on the second input control signal, configured to output the latched address based on the second output count signal, and configured to output the latched error flag signal based on the second output count signal.

17. The semiconductor device of claim 13, further comprising a fuse circuit configured to generate the fuse data for replacing an erroneous one of the normal cell arrays with one of the redundancy cell arrays, based on the latched fail address and the rupture control signal.

18. The semiconductor device of claim 17, wherein the fuse circuit ruptures a fuse corresponding to the latched fail address to prohibit output of the fuse data stored in the fuse circuit.

19. The semiconductor device of claim 18, wherein the rupture of the fuse corresponds to an operation that applies a voltage to the fuse selected by the fuse data to cut the fuse.

* * * * *